(12) United States Patent
Möller et al.

(10) Patent No.: US 6,866,468 B2
(45) Date of Patent: Mar. 15, 2005

(54) LOADING AND UNLOADING STATION FOR A DEVICE FOR THE PROCESSING OF CIRCULAR FLAT WORK-PIECES, ESPECIALLY SEMICONDUCTOR WAFERS

(75) Inventors: Helge Möller, Peissen (DE); Thomas Keller, Osterrönfeld (DE)

(73) Assignee: Peter Wolters CMP-Systeme GmbH & Co. KG, Rendsburg (DE)

( * ) Notice: Subject to any disclaimer, the term of this patent is extended or adjusted under 35 U.S.C. 154(b) by 251 days.

(21) Appl. No.: 10/098,163

(22) Filed: Mar. 13, 2002

(65) Prior Publication Data

US 2003/0177548 A1 Sep. 18, 2003

(51) Int. Cl.[7] .............................................. B65G 49/07
(52) U.S. Cl. ....................... 414/783; 414/936; 414/941
(58) Field of Search .............................. 414/783, 936, 414/941; 294/113, 114, 119.1

(56) References Cited

U.S. PATENT DOCUMENTS

| | | | | |
|---|---|---|---|---|
| 4,685,206 A | * | 8/1987 | Kobayashi et al. | 29/740 |
| 5,046,909 A | * | 9/1991 | Murdoch | 294/113 |
| 5,280,983 A | * | 1/1994 | Maydan et al. | 294/119.1 |
| 5,421,056 A | * | 6/1995 | Tateyama et al. | 15/302 |
| 6,537,416 B1 | * | 3/2003 | Mayer et al. | 156/345.17 |

FOREIGN PATENT DOCUMENTS

DE 197 19 503 11/1998

* cited by examiner

Primary Examiner—Janice L. Krizek
(74) Attorney, Agent, or Firm—Vidas, Arrett & Steinkraus, P.A.

(57) ABSTRACT

The device comprises a carrier for a workpiece; the carrier can be moved along a vertical and a horizontal axis by use of a drive mechanism and has an approximately planar contact surface for the workpiece, whereby the workpiece can be held on the contact surface by a contact mechanism of the carrier, especially vacuum, a retaining ring on the carrier encircling the contact surface and projecting downwards beyond the contact surface and having an inner diameter which is slightly larger than the outer diameter of the workpiece. At least three centering cams are arranged on a circle, the centering cams can be moved synchronously and in a radial direction by use of a centering drive, the centering cams having a supporting surface oriented on the top. The supporting surface has an approximately vertical stop surface as well as a stop being radially outwards of the stop surface adapted to engage the outer side of the retaining ring, when the centering cams are radially moved towards each other and the carrier is set down until coming close to our onto the centering cams. A robot is provided so that a workpiece can be loaded on cams or removed from it, the outer diameter of the retaining ring and the position of the stop surface and of the stop being dimensioned such that the workpiece is arranged approximately in a centered way relative to the vertical axis of the carrier when the stops of the centering cams engage the retaining ring.

15 Claims, 8 Drawing Sheets

LOADING AND UNLOADING STATION FOR A DEVICE FOR THE PROCESSING OF CIRCULAR FLAT WORK-PIECES, ESPECIALLY SEMICONDUCTOR WAFERS

CROSS-REFERENCE TO RELATED APPLICATIONS

Not Applicable.

STATEMENT REGARDING FEDERALLY SPONSORED RESEARCH

Not Applicable.

BACKGROUND OF THE INVENTION

In the field of microelectronics, circuits are manufactured by means of superimposed and differently structured layers of different materials. In order to achieve the desired planarity, processing has to take place subsequent to each coating of a semiconductor wafer with a layer, for example an oxide layer, a tungsten layer or other metal layers, otherwise problems will occur, for example within lithographic processes, namely in the form of focus faults due to a low depth of sharpness of the UV stepper or in the form of fissures of the conductor paths.

A process used in the current semiconductor industry and designed for the planarisation exploits the so-called CMP process consisting in a chemical mechanical processing by means of a fluid (slurry), the chemically reactive part of the slurry being bound to transform the material into a polishable condition. The slurry contains an abrasive in form of colloidal abrasive particles.

A device for the chemical mechanical polishing of surfaces has been published in DE 197 19 503 A1. It comprised two polishing units with height adjustable vacuum carriers for one semiconductor wafer each which can be rotated about a vertical axis by a driving motor. The polishing units are guided independently from each other along two parallel guides extending approximately horizontally. Polishing tables driven in rotation are arranged below the guides and cooperate with the polishing units. At one end of the guides, at least one device is provided for the semiconductor wafers. Furthermore, loading and unloading devices for the semiconductor wafers are provided on the opposite side of the guides, towards the polishing units can be aligned and which can be reached by a transfer device. In most of the cases, the delivery and take over takes place by a robot.

During the transport of the wafers and the polishing process described above, the wafers are held by a chuck or a so-called carrier the task of which is to generate a homogenous pressure profile or different pressure profiles onto the rear side of the workpiece, the so-called loaded side, i.e. the side provided with the circuits, being oriented towards the polishing table. Usually, the carrier is held and moved by an actuation device turning the carrier around a vertical axis on the one hand and on the other hand moving it in a linear, vertical and horizontal direction.

In most cases, a wafer is held at the carrier by vacuum. First of all, the wafer must be brought into contact with the supporting or engagement surface of the carrier before the vacuum can transfer its holding force to the wafer. During the polishing process, the circular workpiece, for example the wafer, is stabilized by the outer rim of the carrier protruding beyond the supporting surface of the carrier and having an inner diameter which is slightly larger than the outer diameter of the wafer. In order to achieve high quality polishing results on the workpiece, especially in the radially marginal portion of the workpiece, it is absolutely necessary to dimension the protruding edge formed by a retaining ring in such a way that the circular space between the workpiece and the ring is minimized and uniform along the circumference.

BRIEF SUMMARY OF THE INVENTION

The invention is based on the objective to provide a loading and unloading station which positions the workpiece relative to the retaining ring in a way enabling a reliable reception of the workpiece. Furthermore, the loading and unloading station is to work in a failure tolerant way in order to compensate for tolerance inaccuracies. The loading and unloading station according to the invention may include a horizontal loading surface which can be moved by means of a first drive means along a vertical axis. One possible position of the vertical axis positions the loading surface at the same height as the supporting faces of the centering cams, another position is by far lower than the supporting surface of the centering cams. The transfer mechanism which is usually formed by a robot loads the workpiece on the supporting surface of the centering cams. The contact surface of the carrier can be oriented above the loading surface if provided so that the loading surface is capable of bringing the workpiece into contact with the contact surface of the carrier when being lifted. In any case, the workpiece has to be centered relative to the carrier. For doing so, the loading station has at least three centering cams arranged on a circle encircling the loading surface, preferably at equal circumferential spaces therebetween. By means of a centering drive, the centering cams can synchronously, radially be moved from the inside to the outside and vice versa the centering cams having a supporting surface upwardly directed for the workpiece which supporting surface including an upwardly extending stop surface. Furthermore, the centering cams are provided with a stop which is, in a radial position, located radially outward with respect to the stop face and which stop engages the retaining ring of the carrier when the centering cams are moved in a radially inward direction and the chuck or carrier is set down close to or onto the centering cams. The outer diameter of the retaining ring on the carrier and the position of the supporting surface and the stop are dimensioned in such a way that the workpiece is approximately centered relative to the vertical axis of the carrier when the stops of the centering cams are in engagement with the retaining ring.

The mechanical stops ensure automatic compensation for possible irregularities, such as tolerances with components and mounting, inaccuracies of positions and the reversal tolerance along the horizontal axis.

The centering cams can vertically be supported by means of a spring, thus enabling inaccuracies of the position during the vertical positioning to be compensated.

Preferably, the material of the supporting surface of the centering cams consists of an abrasive resistant synthetic. The loading surface is preferably concave, thus ensuring the guidance of the workpiece in the marginal portion. Furthermore, the concave form of the loading surface, in connection with the carrier, can also be used for the formation of a cleaning chamber. The contact surface of the carrier as known in the art has bores designed for the application of the vacuum on the workpiece. Moreover, various media, such as compressed air, water, slurry or nitrogen can be supplied. The loading surface can present appropriate draining bores for the draining of DI-water and residual slurry. To this end, it is also advantageous if the material of the loading surface is media proof in the range of pH1 to pH13.

Various construction modes are possible in order to form the centering cams. One of the possibilities consists in forming them as levers being supported for pivoting about a vertical axis and actuated for horizontal movement by the centering drive. Alternatively, the centering cams can also be moved in a linear direction. The centering drive can be realized by an electromechanic or pneumatic mechanism, for example.

It should be noted that for the invention the provision of the loading surface is not mandatory.

DETAILED DESCRIPTION OF THE INVENTION

Figure 1:
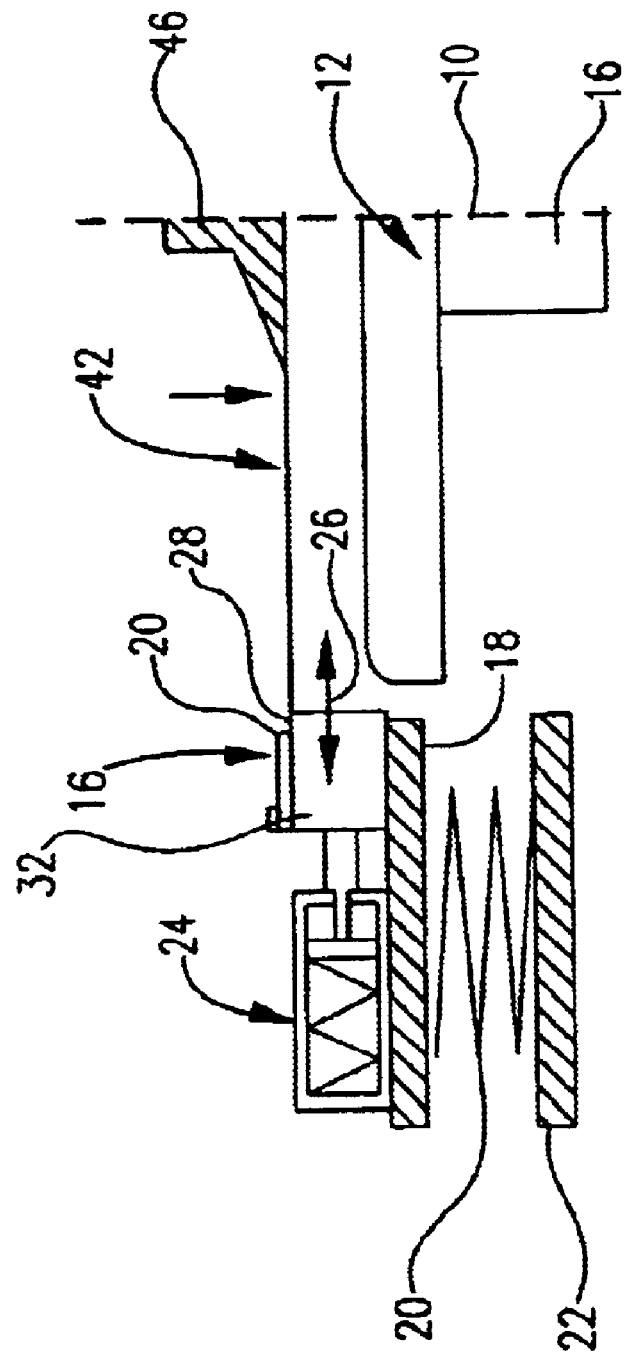
FIGS. 1–4 each schematically show one half of a loading and unloading station according to the invention in various phases of operation.

While this invention may be embodied in many different forms, there are described in detail herein a specific preferred embodiment of the invention. This description is an exemplification of the principles of the invention and is not intended to limit the invention to the particular embodiment illustrated.

FIGS. 1 to 4 depict a loading and unloading station as described in DE 199 11 295 A1, for example. FIGS. 1 to 4 illustrate only one half on the left side of a vertical central axis 10 in a sectional view. One can recognize a loading plate 12 which can be positioned in a vertical direction by a lifting device 14 which is not illustrated in detail. Four centering cams 16 are arranged on a circle encircling the loading plate 12. The centering cams 16 are supported by a slab 18 supported by a lower plate 22 by means of a spring 20. A pneumatic centering drive 24 is arranged on the slab 18, which centering drive is coupled with the centering cams 16 (Only one centering cam is illustrated in FIGS. 1 to 4), in order to move the centering cams 16 along the double arrow 26. This movement can be in a linear direction. Alternatively, the centering cam 16 can also be a lever (not represented) which is pivotable about a vertical axis and is horizontally pivoted by the centering drive 24.

On its top, the centering cam 16 is provided with a supporting surface 28 which is limited radially outward by a stop surface 30. Moreover, there is a stop 32 on the centering cam 16 in the shape of a pin oriented upwardly which is located radially outwards of the stop surface 30.

Figure 2:
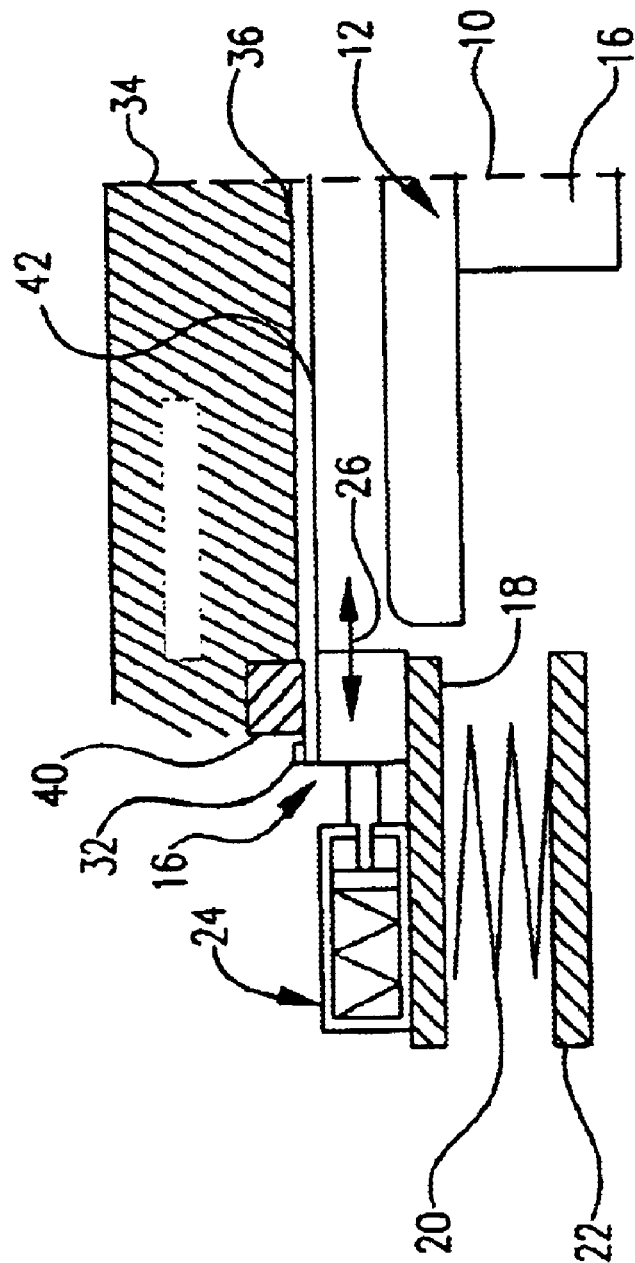
Figure 3:
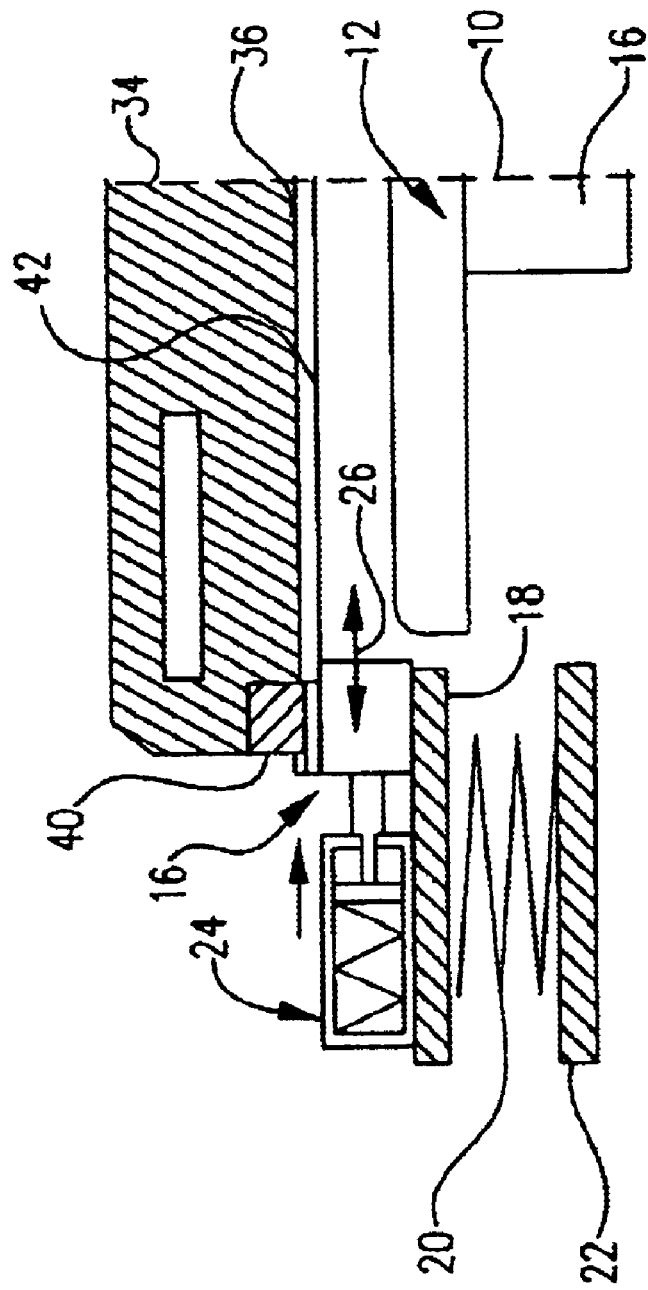
Figure 4:
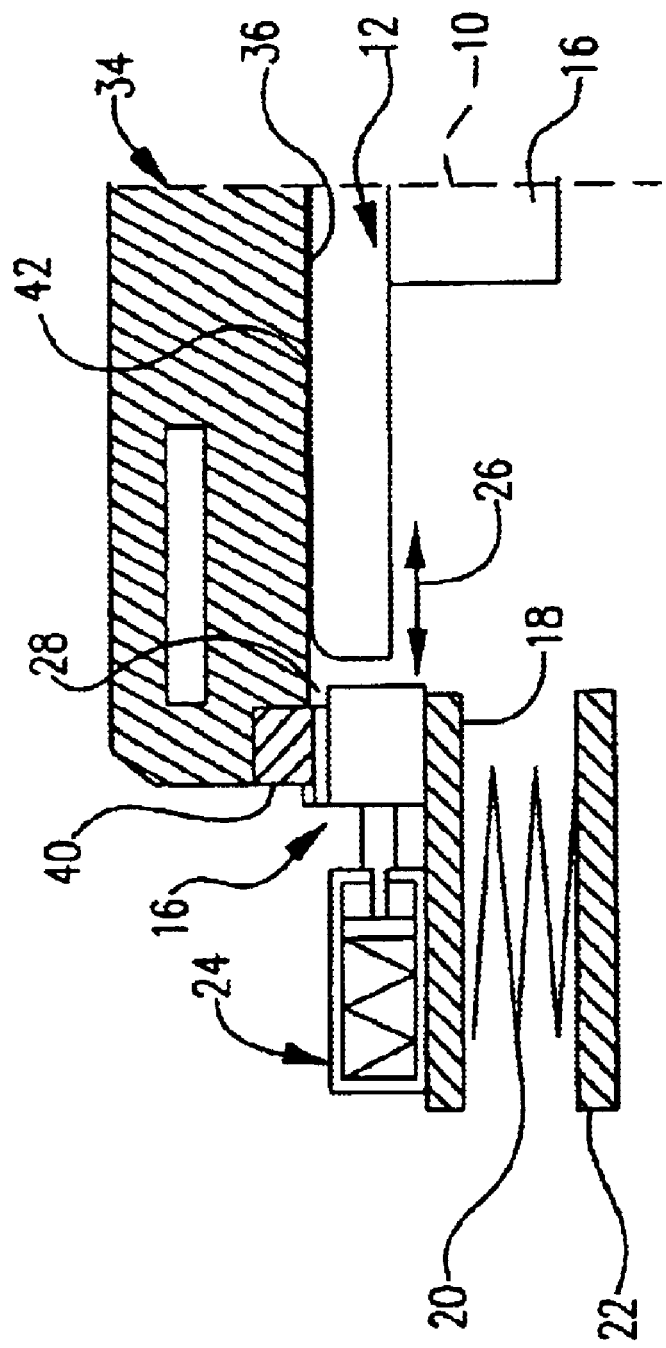

In FIGS. 2 to 4, one can recognize a carrier or chuck 34, such as it is used for the holding and the transport of circular wafers. It can be moved both vertically and horizontally (also refer to DE 199 11 294) by drive means (not represented). At its lower side, the carrier 34 is provided with a contact surface 36 against which the workpiece is placed and where it is held by vacuum which can be applied by vacuum bores (not illustrated) in the contact surface 36.

The circular carrier 34 has a circular retaining ring 40 at its circumference at the lower side. The exterior surface of the retaining ring 40 is aligned with the exterior surface of the carrier 34. The lower portion of the retaining ring 40 is slightly protruding beyond the contact surface 36. The inner diameter of the retaining ring 40 is dimensioned in order to be slightly larger than the outer diameter of a wafer 42. Consequently, the retaining ring 40 restrains a wafer received (FIG. 4).

The loading of the carrier 34 with a wafer 42 is as follows. A loading robot the details of which are not shown holds a wafer 42 as shown at 46 and deposits it onto the supporting surfaces 28 of the centering cams 16. The stop surfaces 30 are positioned to allow the wafer 42 to be deposited without problems and without touching the stop surfaces 30. During this process, the carrier 34 is in a lateral position thus not disturbing said operation.

Then, the carrier 34 is brought into a defined vertical position where its axis is oriented relative to the axis of the loading plate 12 or the center of the circle of the centering cams, respectively, and both axes coincide with the axis 10. By the way, the carrier is provided with thin bores (not shown) by means of which various media can be supplied such a compressed air, vacuum, DI-water, slurry or nitrogen. When the vertical alignment is achieved, the carrier 34 is set down until the retaining ring 40 lies on the centering cams 16 (FIG. 2), i.e. over the supporting surfaces 28 thereof. Then, the centering cams 16 are moved radially inwards until this movement is stopped by the stop pin 32 engaging the exterior side of the retaining ring 40. During this process, the wafer 42 is centered relative to the carrier 34. The radial space between the stop surfaces 30 of the centering cams 16 is dimensioned such that the wafer 42 is in a centered position between the stop surfaces 30 when the stop pin 32 engages the retaining ring 40 (FIG. 3). It is appropriate for this operation that the drive of the centering cams 16 works synchronously.

Subsequently, the loading plate 12 is driven upwards and the wafer is made adjacent and brought into engagement with the contact surface 42 of the carrier 34 (FIG. 4). The centering of the wafer described above has the effect that the small radial and annular space between the circumference of the wafer and the inner surface of the retaining ring 40 is constant. Irregularities, such as component and mounting tolerances, positioning inaccuracies, reversal tolerances along the horizontal axis, etc., are automatically compensated by means of the centering operation described above. After having brought the wafer 42 against the contact surface 36, vacuum is generated via the internal bore or channels (not shown) of the carrier 34 in order to hold the wafer 42. Then, the carrier 34 transports the wafer to a polishing section as described in DE 199 11 294 for example.

Unloading starts subsequent to the processing of the wafer 42. To this end, the carrier 34, which is again vertically oriented with respect to the loading plate 12 in a lower position thereof as represented in FIG. 2. The centering cams 16 are moved radially outwardly so that the stop pins 32 have no contact any more with the retaining ring 40. The carrier is in contact with the upper side of the loading table. The vacuum on the carrier 34 is switched off, compressed air and DI-water can be supplied through the internal bores in order to remove the wafer 42 from the carrier. The loading plate 12 takes the wafer 42 into a lower vertical position. Then, the wafer 42 lies on the supporting surfaces 28 of the centering cams 16. The loading plate 42 can be designed on its upper loading surface as to support the workpiece only in marginal area (the loading table is concave). Subsequent to the removal of the wafer 42, the station described above can also be used as a cleaning station for the carrier 34. As already mentioned, the loading surface of the loading plate can be concave to this end and form a hollow space in conjunction with the carrier 34 when both parts are driven against each other, thus creating a cleaning chamber. In order to achieve a draining from this cleaning chamber, the loading plate 12 is provided with draining bores (not shown) for the draining of DI-water and residual slurry.

Figure 5:
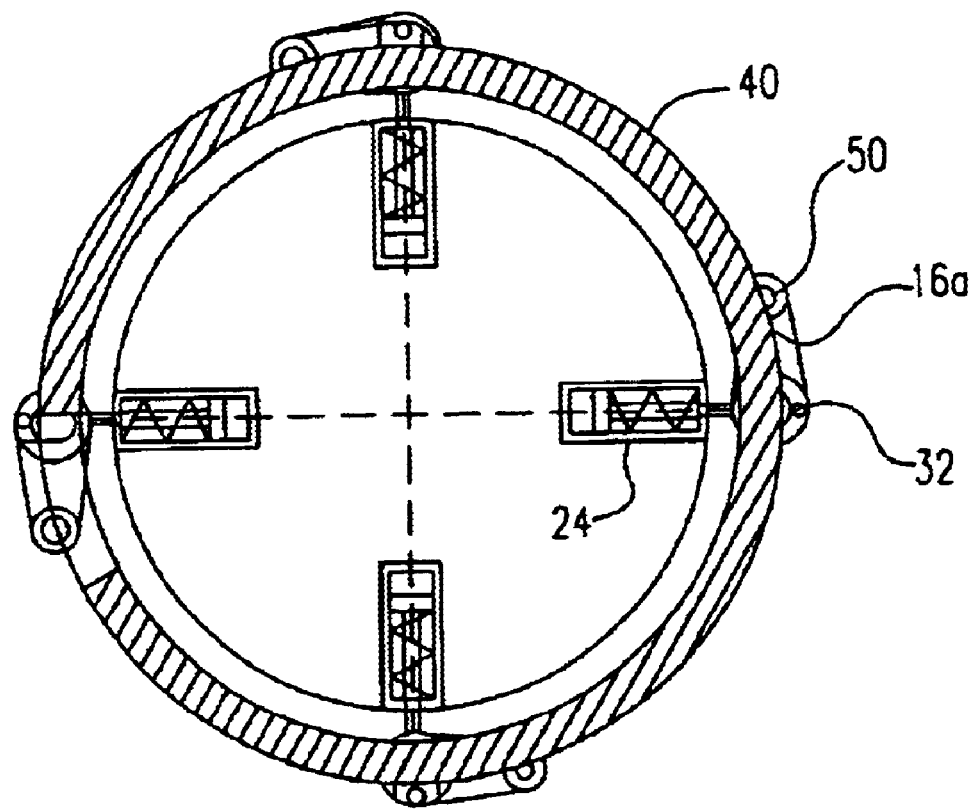
FIG. 5 schematically shows the top view on a centering mechanism in opened condition.
Figure 6:
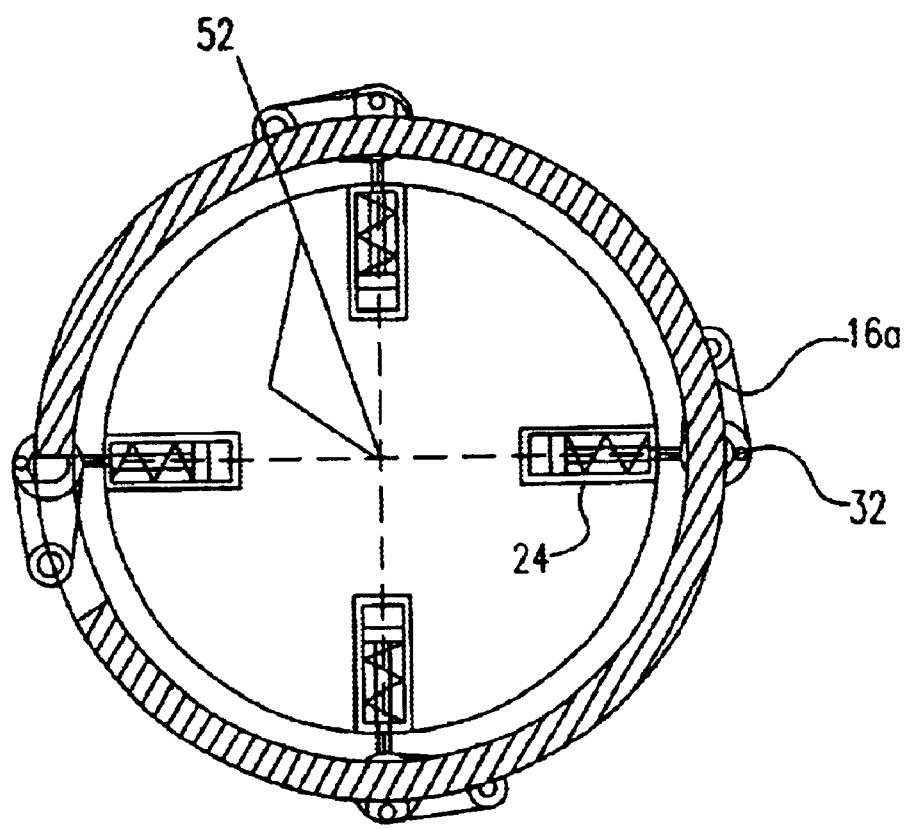
FIG. 6 shows the centering mechanism according to FIG. 5 in closed position.

FIGS. 5 and 6 show a realization mode for the centering cams. One can recognize four centering cams 16a formed as levers and rotatable about a vertical axis 50. The lever could be swung horizontally by means of the actuation device 24 thus radially shifting for example more or less the stop pin 32. In FIG. 5, it is remote from the exterior of the retaining ring 50 of the carrier which is not represented. In FIG. 6, the stop pin 52 is adjacent to the retaining ring. The slight and still admissible offset between the vertical axis of the carrier 34 on the one hand and the axis of the centering device (shown) on the other hand is outlined at 52 in FIG. 6.

Figure 7:
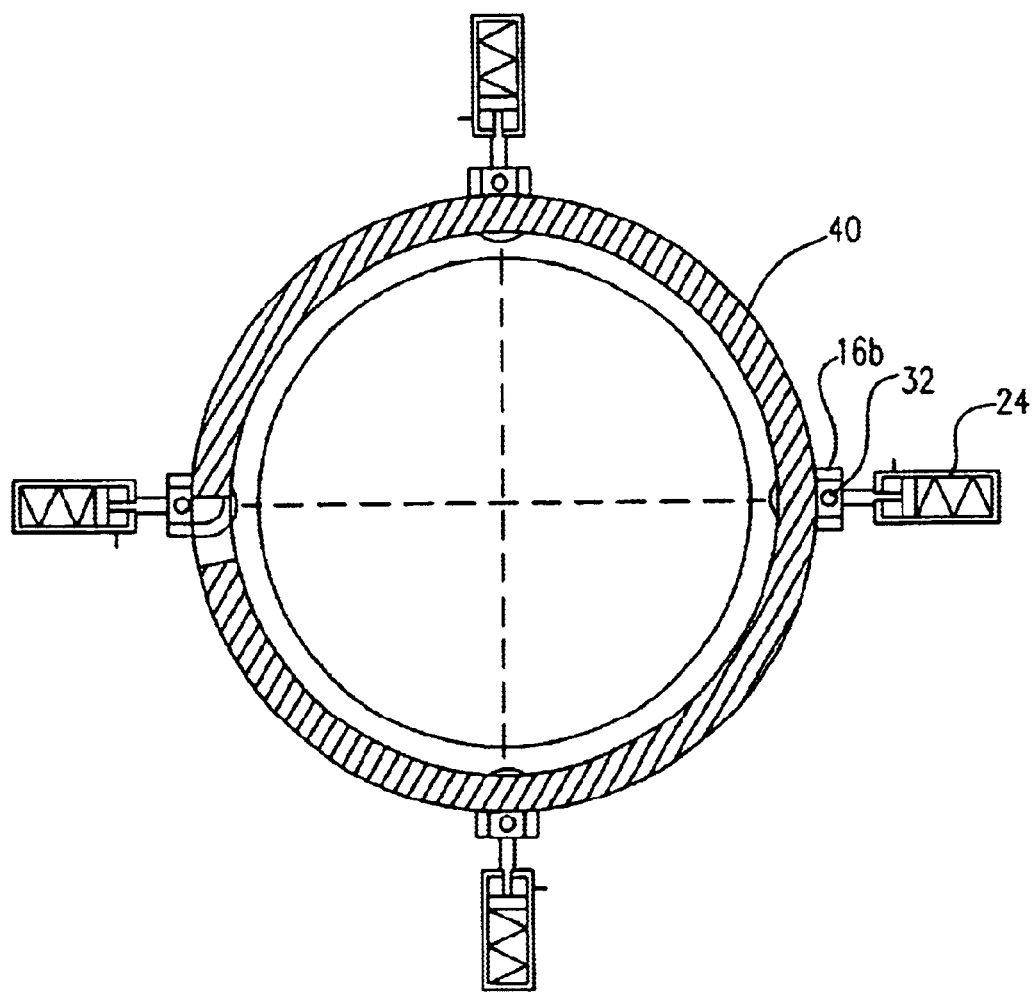
FIG. 7 shows another mode of realization of a centering mechanism in opened condition.
Figure 8:
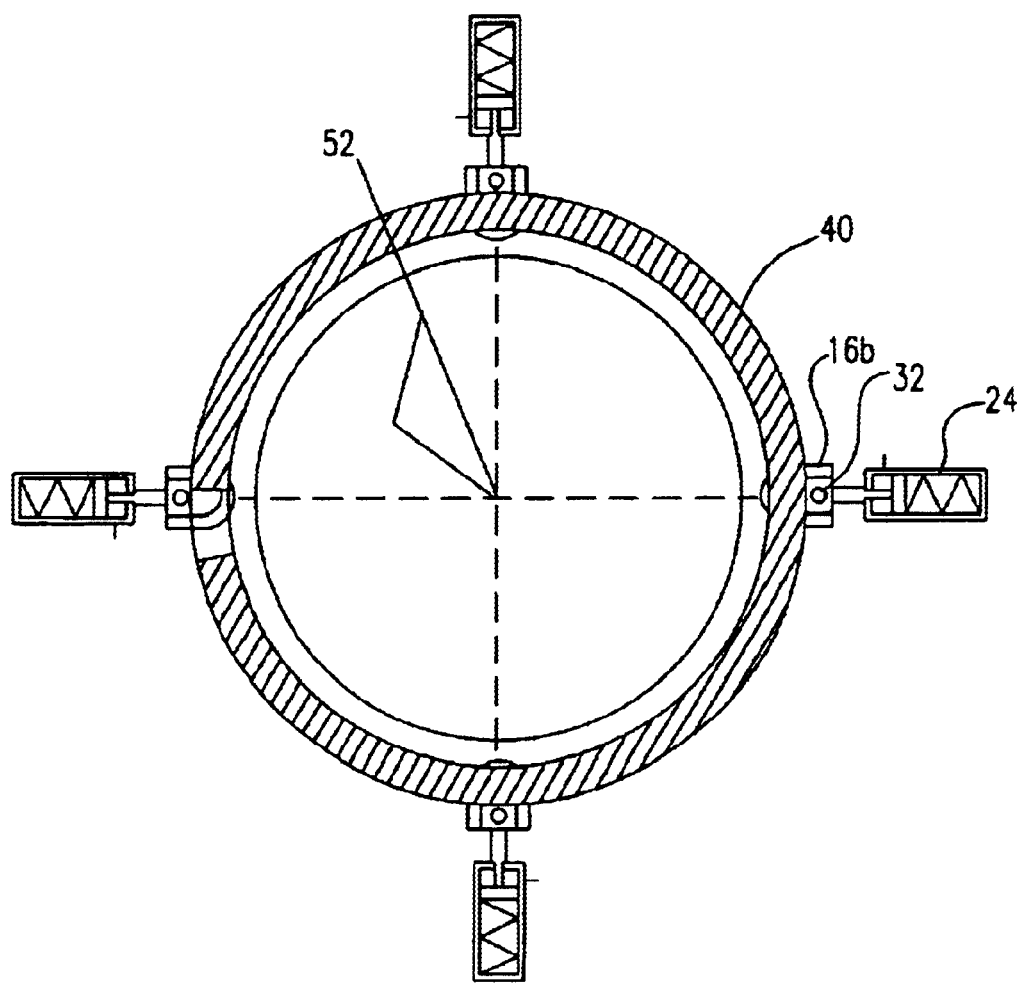
FIG. 8 shows the centering mechanism according to FIG. 7 in opened condition.

In the realization mode according to FIGS. 7 and 8, the four centering cams 16b can radially be moved and are actuated by means of the actuation device 24. The stop pin 32 in FIG. 7 is remote from the retaining ring 40, whereas it is adjacent to the retaining ring 40 in FIG. 8. FIG. 8, in its turn, outlines an offset between the axes already described.

What is claimed is:

1. Loading and unloading station for a device for the processing of circular flat workpieces, particularly semiconductor wafers, comprising:

a carrier (34) for carrying a workpiece (42), the carrier can be moved along a vertical and a horizontal axis by a first drive means, the carrier has an approximately planar lower contact surface (36) and vacuum engagement means whereby the workpiece (42) is adapted to be held against the contact surface (36) by the vacuum engagement means, a retaining ring (40) integral to the carrier (34) encircling the lower contact surface (36) and projecting downwards beyond the contact surface (36), the retaining ring (40) has an inner diameter which is slightly larger than the outer diameter of the workpiece (42) and an outer circumferential surface, at least three centering cams (16) arranged in a circumferentially spaced relationship on a circle and which can be moved synchronously and radially inwards and outwards by second drive means (24), the centering cams (16) each having a upper adapted to support the workpiece (42) placed onto the cam (16) from above, each supporting surface (28) having an approximately vertical stop surface (30), as well as a stop (32), the stop (32) being arranged radially outwardly with respect to the vertical stop surface (30), the stop (32) being adapted to engaged the outer circumferential surface of the retaining ring (40) when the centering cams (16) are moved radially inwardly and the carrier (34) is lowered close to or onto the centering cams (16), a robot (46) by means of which a workpiece (42) is deposited on the supporting surfaces of the centering cams (16), the dimension of the retaining ring (40) and the location of the stop surface (30) and the stop (32) being such that the workpiece (42) is approximately centered relative to the vertical axis of the carrier (34) above the centering cams when the stops (32) of the centering cams (16) are in engagement with the outer circumferential surface of the retaining ring (40) whereby the carrier (34) can pick up and hold the workpiece (42) at the lower contact surface by the vacuum engagement means in centered orientation and control means for controlling the first and second drive means.

2. Loading and unloading station according to claim 1, characterized in that the centering cams (16) are vertically supported by means of a spring (20).

3. Loading and unloading station according to claim 1, characterized in that the material of the supporting surface (28) of the centering cams (16) consists of an abrasion resistant synthetic.

4. Loading and unloading station according to claim 1, characterized in that the loading surface is concave.

5. Loading and unloading station according to claim 1, characterized in that the loading surface has bores or channels adapted to remove fluids and residual matter from the loading surface and to supply a fluid to the loading surface.

6. Loading and unloading station according to claim 1, characterized in that the material of the loading surface is resistant against substances having a pH between 1 and 13.

7. Loading and unloading station according to claim 1, characterized in that the centering cams (16b) are moved in a linear direction.

8. Loading and unloading station according to claim 1, characterized in that the second drive means are defined by a pneumatic or an electro-mechanical drive.

9. Loading and unloading station according to claim 1, characterized in that a cleaning device is provided for the cleaning of the carrier (34).

10. Loading and unloading station according to claim 1, characterized in that the supporting surface (28) of the centering cams (16) supports only a marginal portion of the workpiece.

11. Loading and unloading station according to claim 1, characterized by a horizontal loading surface (12) inside of the circle defined by the centering cams (16) and movable by third drive means (14) along a vertical axis in order to move the centered workpiece (42) on the supporting surface upwardly against the contact surface (36) of the carrier (34).

12. Loading and unloading station according to claim 11, characterized in that a drip tub is arranged beneath the loading surface (12).

13. Loading and unloading station according to claim 11, characterized in that the loading surface is formed on a loading table (12).

14. Loading and unloading station according to claim 1, characterized in that the centering cams are defined by levers (16a) pivotable about a vertical axis and the second drive means (24) acts on the lever (16a).

15. Loading and unloading station according to claim 14, characterized in that respectively one cam plate for the actuation of the lever (16a) is arranged between the second drive means and the lever (16a).

* * * * *